United States Patent
Kim et al.

(10) Patent No.: US 8,541,841 B2
(45) Date of Patent: Sep. 24, 2013

(54) SEMICONDUCTOR DEVICES AND SEMICONDUCTOR DEVICE MANUFACTURING METHODS

(75) Inventors: Won-joo Kim, Hwaseong-si (KR);
Sang-moo Choi, Yongin-si (KR);
Tae-hee Lee, Yongin-si (KR);
Yoon-dong Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/412,248

(22) Filed: Mar. 5, 2012

(65) Prior Publication Data

US 2012/0161277 A1 Jun. 28, 2012

Related U.S. Application Data

(63) Continuation of application No. 12/591,718, filed on Nov. 30, 2009, now abandoned.

(30) Foreign Application Priority Data

Dec. 1, 2008 (KR) .................. 10-2008-0120682

(51) Int. Cl.
*H01L 27/12* (2006.01)

(52) U.S. Cl.
USPC ............. 257/347; 257/E27.112; 257/E21.32; 257/E21.561; 257/E21.545

(58) Field of Classification Search
USPC ........ 257/E27.112, 21.32, E21.561–E21.564, 257/347, 390, E27.084, E27.085, E27.098, 257/E29.309, E29.33, 371, 257/E27.065–E27.067, E29.261, E21.63
See application file for complete search history.

(56) References Cited

U.S. PATENT DOCUMENTS

| | | | |
|---|---|---|---|
| 6,277,703 B1 | 8/2001 | Barlocchi et al. | |
| 2001/0042871 A1 | 11/2001 | Noble | |
| 2003/0146488 A1 | 8/2003 | Nagano et al. | |
| 2004/0155281 A1 | 8/2004 | Osada et al. | |
| 2006/0046408 A1* | 3/2006 | Ohsawa | 438/309 |
| 2007/0057307 A1* | 3/2007 | Shum et al. | 257/314 |
| 2007/0210418 A1 | 9/2007 | Nakajima | |
| 2009/0134468 A1* | 5/2009 | Tsuchiya et al. | 257/368 |

FOREIGN PATENT DOCUMENTS

| | | |
|---|---|---|
| KR | 10-2003-0043411 | 6/2003 |
| KR | 10-2007-0087503 | 8/2007 |

OTHER PUBLICATIONS

Chinese Office Action dated Apr. 17, 2013, issued in Chinese Application No. 200910246685.7.

* cited by examiner

*Primary Examiner* — Steven Loke
*Assistant Examiner* — Cuong B Nguyen
(74) *Attorney, Agent, or Firm* — Harness, Dickey & Pierce, P.L.C.

(57) ABSTRACT

Semiconductor devices and semiconductor device manufacturing methods. The semiconductor device manufacturing methods may form a memory cell having a silicon on insulator (SOI) structure only in one or more localized regions of a bulk semiconductor substrate by use selective etching. Accordingly, a different bias voltage may be applied to a peripheral device than to a memory cell having the SOI structure.

5 Claims, 21 Drawing Sheets

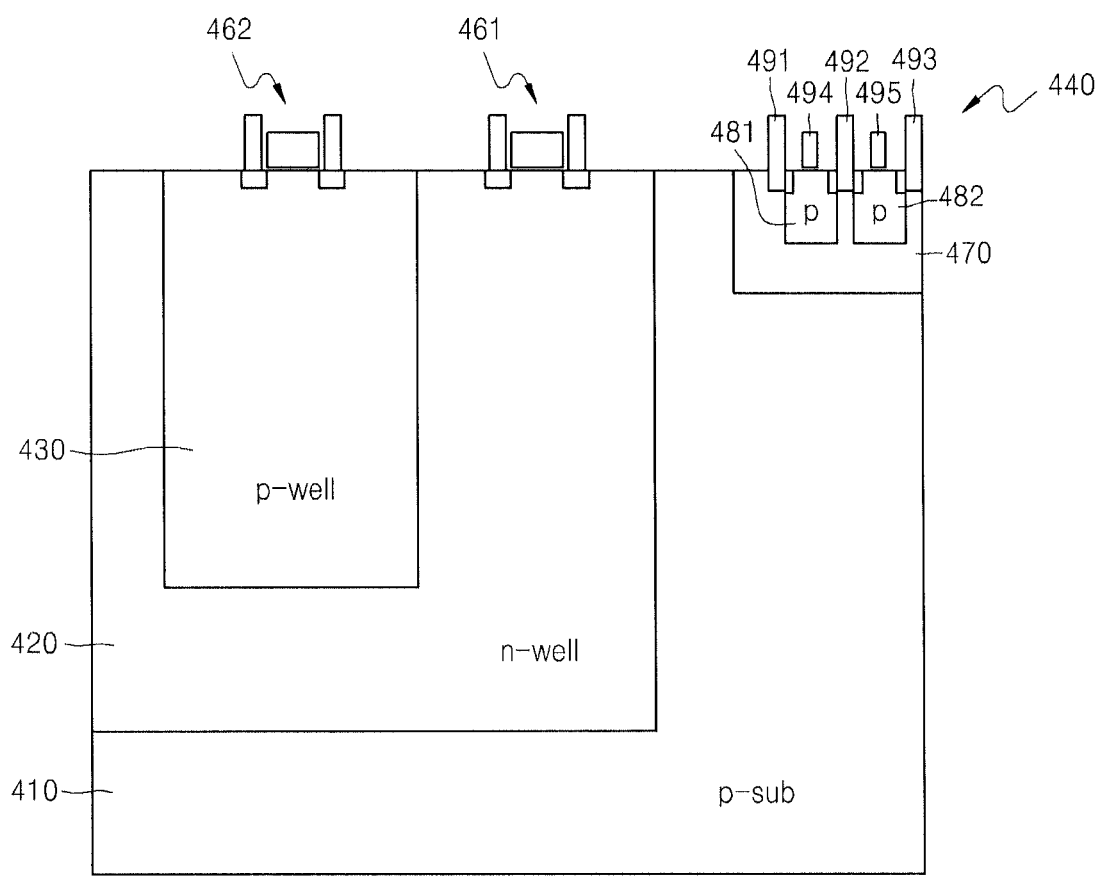

SEMICONDUCTOR DEVICES AND SEMICONDUCTOR DEVICE MANUFACTURING METHODS

CROSS-REFERENCE TO RELATED APPLICATIONS

This application is a continuation of U.S. application Ser. No. 12/591,718, filed Nov. 30, 2009, which claims priority under 35 U.S.C. §119 to Korean Patent Application No. 10-2008-0120682, filed on Dec. 1, 2008, in the Korean Intellectual Property Office (KIPO), the entire contents of each of which is incorporated herein by reference.

BACKGROUND

1. Field

The inventive concepts relate to semiconductor devices and semiconductor device manufacturing methods, and more particularly, to semiconductor device manufacturing methods capable of forming memory cells having a localized silicon on insulator (SOI) structure, the SOI structure localized to one or more regions by using selective etching methods.

2. Description of the Related Art

A one-transistor (1-T) dynamic random access memory (DRAM) is a memory implemented by using a single transistor without including a capacitor. The 1-T DRAM can be manufactured by performing a simple process and has an improved sensing margin.

However, the 1-T DRAM should be implemented on an SOI wafer and manufacturing costs increase due to the increased cost of an SOI wafer. Also, since SOI wafer properties are not yet completely verified, the 1-T DRAM cannot be manufactured as a stand-alone type and should be manufactured as an embedded type.

SUMMARY

The inventive concepts provide semiconductor device manufacturing methods capable of forming a memory cell having a silicon on insulator (SOI) structure in one or more localized regions of a bulk substrate by using selective etching.

According to example embodiments of the inventive concepts, there may be provided methods of manufacturing semiconductor devices, the methods including forming one or more floating body patterns in a region of a bulk substrate, dividing the region of the bulk substrate into a lower bulk substrate region and a floating body region by etching lower regions of the one or more floating body patterns and filling a region between the floating body region and the lower bulk substrate region with an insulating material.

According to aspects of the inventive concepts, there may be provided methods of manufacturing semiconductor devices, the methods including forming a well in a bulk substrate of a first conductive type and forming a silicon on insulator (SOI) structure in the well. The forming of the SOI structure may include forming one or more floating body patterns in the well, dividing the well into a lower well region and a floating body region by etching lower regions of the one or more floating body patterns and filling a region between the floating body region and the lower well region with an insulating material.

According to example embodiments of the inventive concepts, a plurality of wells may be formed including a second well of a second conductive type in the bulk substrate of the first conductive type and forming a third well of the first conductive type in the second well of the second conductive type. The forming of the well may include forming the well of the first conductive type in the second well. The forming of the SOI structure may include forming the SOI structure in the well of the first conductive type.

According to aspects of the inventive concept, there may be provided methods of manufacturing a semiconductor device, the method including forming a plurality of wells in a first region of a bulk substrate of a first conductive type and forming a silicon on insulator (SOI) structure including a portion of the bulk substrate, in which the plurality of wells are not formed. The forming of the SOI structure may include forming one or more floating body patterns in the portion of the bulk substrate, in which the plurality of wells are not formed; dividing the portion of the bulk substrate, in which the plurality of wells are not formed, into a substrate region and a floating body region by etching lower portions of the one or more floating body patterns; and filling a portion between the floating body region and the substrate region with an insulating material.

According to example embodiments of the inventive concepts, there may be provided semiconductor devices, the semiconductor devices including a substrate region of a first conductive type bulk substrate, an insulating region in the substrate region and a floating body region on the insulating region and separated from the substrate region by the insulating region, the floating body region and the substrate region including materials having similar characteristics.

According to example embodiments of the inventive concepts, there may be provided semiconductor devices, the semiconductor devices including a localized silicon on insulator (SOI) structure including a substrate region of a first conductive type bulk substrate, a well in the substrate region, an insulating region in the well, and a floating body region on the insulating region and separated from the well by the insulating region, the floating body region and the well including materials having similar characteristics.

According to example embodiments of the inventive concepts, there may be provided semiconductor devices, including a localized silicon on insulator (SOI) structure including a first substrate region of a first conductive type bulk substrate, a plurality of wells in the first substrate region, an insulating region in a second substrate region of the bulk substrate and a floating body region on the insulating region and separated from the second substrate region by the insulating region, the second substrate region and the floating body region including materials having similar characteristics.

BRIEF DESCRIPTION OF THE DRAWINGS

Example embodiments of the inventive concepts will be more clearly understood from the following brief description taken in conjunction with the accompanying drawings. FIGS. 1-11 represent non-limiting, example embodiments as described herein.

FIG. 1 is a cross-sectional diagram of a semiconductor device according to example embodiments of the inventive concepts;

FIG. 4 is a cross-sectional diagram of a semiconductor device according to example embodiments of the inventive concepts;

FIG. 5 is a cross-sectional diagram of a semiconductor device according to example embodiments of the inventive concepts;

FIG. 6 is a cross-sectional diagram of a semiconductor device according to example embodiments of the inventive concepts;

FIG. 7 is a cross-sectional diagram of a semiconductor device according to example embodiments of the inventive concepts;

FIG. 10 is a cross-sectional diagram of a semiconductor device according to a comparative example of the inventive concepts; and FIG. 11 is a cross-sectional view of a semiconductor device according to a comparative example of the inventive concepts.

Figure 1:
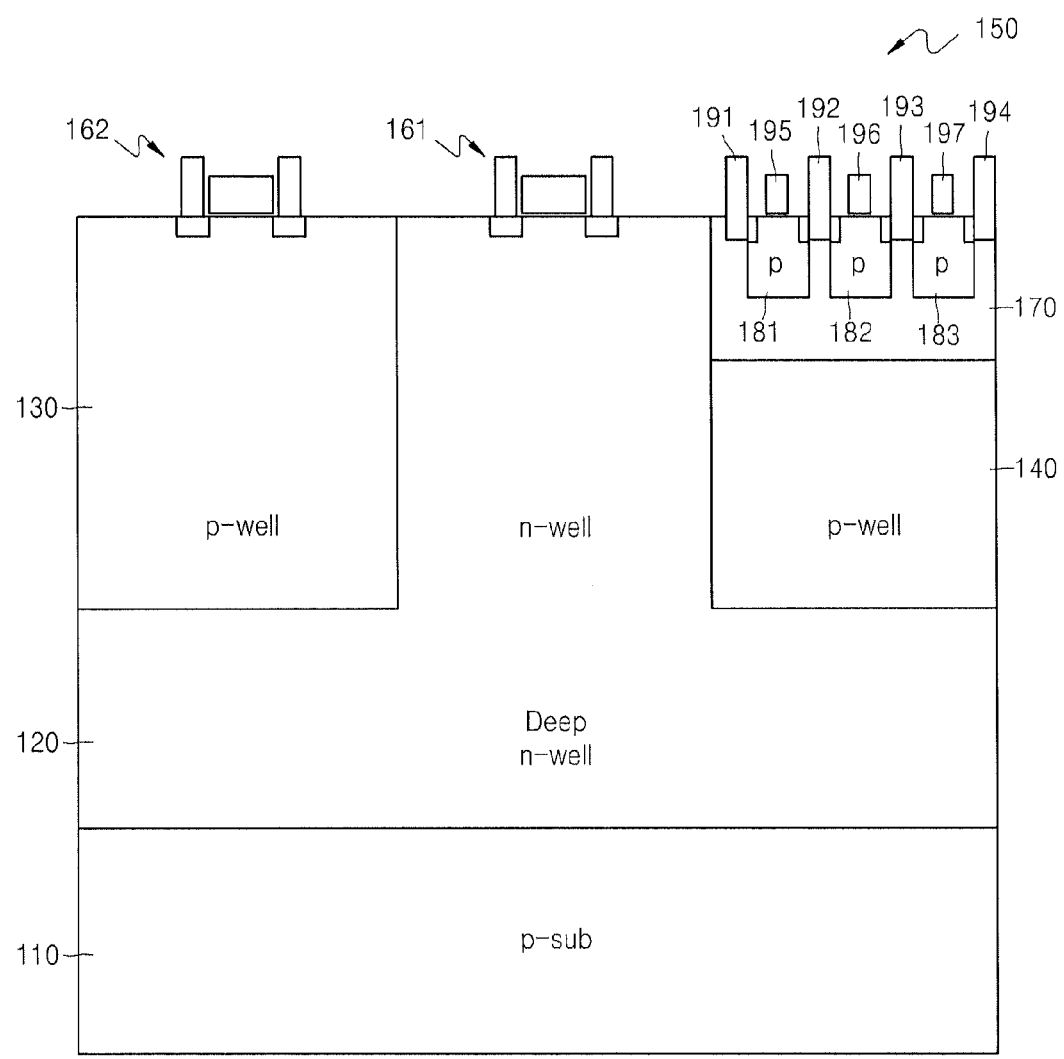

It should be noted that these Figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments of the inventive concepts. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments of the inventive concepts will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional diagram of a semiconductor device according to example embodiments of the inventive concepts. Referring to FIG. 1, the semiconductor device may include a substrate region 110, first through third wells 120, 130, and 140, and a silicon on insulator (SOI) structure 150. The SOI structure may be in the third well 140. The SOI structure 150 may include an insulating region 170 and body regions 181, 182, and 183. The insulating region 170 and the body regions 181, 182, and 183 may be formed by, for example, selectively etching an upper region of the third well 140. The third well 140 and the body regions 181, 182, and 183 may be of materials having similar characteristics.

Because the SOI structure 150 in the third well 140 may be separated from components in the first and second wells 120 and 130, different bias voltages may be applied to the SOI structure and the components in the first and second wells 120 and 130.

Memory cells (e.g., one-transistor (1-T) dynamic random access memory (DRAM) cells) may be on the SOI structure 150 in the third well 140 and driving circuits for driving the memory cells may be on the first and second wells 120 and 130. The memory cells on the third well 140 may be electrically separated from the driving circuits on the first and second wells 120 and 130. Different bias voltages may be applied to the memory cells and the driving circuits. Table 1 shows examples of applicable bias voltages. If the bias voltages shown in Table 1 are applied, a PNP latch phenomenon may be prevented and/or reduced.

TABLE 1

V110 (substrate region) <= 0 V
V120 (first well) >= V110 (substrate region)
V120 (first well) >= 0 V
V130, V140 (second well, third well) <= 0 V
V120 (first well) > V130, V140 (second well, third well)

A p-channel metal-oxide semiconductor (PMOS) transistor 161 may be on the first well 120 and an n-channel metal-oxide semiconductor (NMOS) transistor 162 may on the second well 130. 1T-DRAM cells 191-197 may be on the third well 140. The PMOS transistor 161 and the NMOS transistor 162 may be peripheral circuits for driving the 1T-DRAM cells 191-197. The 1T-DRAM cells 191-197 and the peripheral circuits (the PMOS transistor 161 and the NMOS transistor 162) may be driven by applying different bias voltages to the first through third wells 120, 130, and 140. For example, as shown in Table 1, a negative back bias voltage may be applied to the substrate region 110.

Although the substrate region 110 and the second and third wells 130 and 140 are shown as p-type, and the first well 120 is shown as n-type in FIG. 1, example embodiments of the inventive concepts are not limited thereto.

Figure 2A:
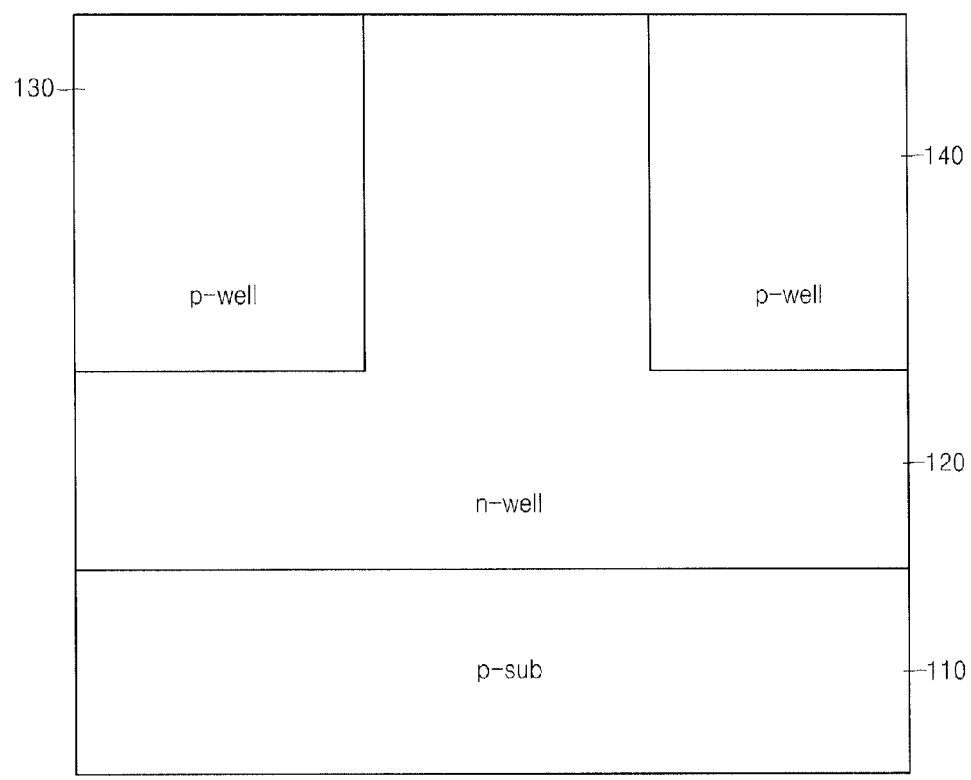
FIGS. 2A-2C are cross-sectional diagrams illustrating a method of manufacturing the semiconductor device shown in FIG. 1 according to example embodiments of the inventive concepts.
Figure 2B:
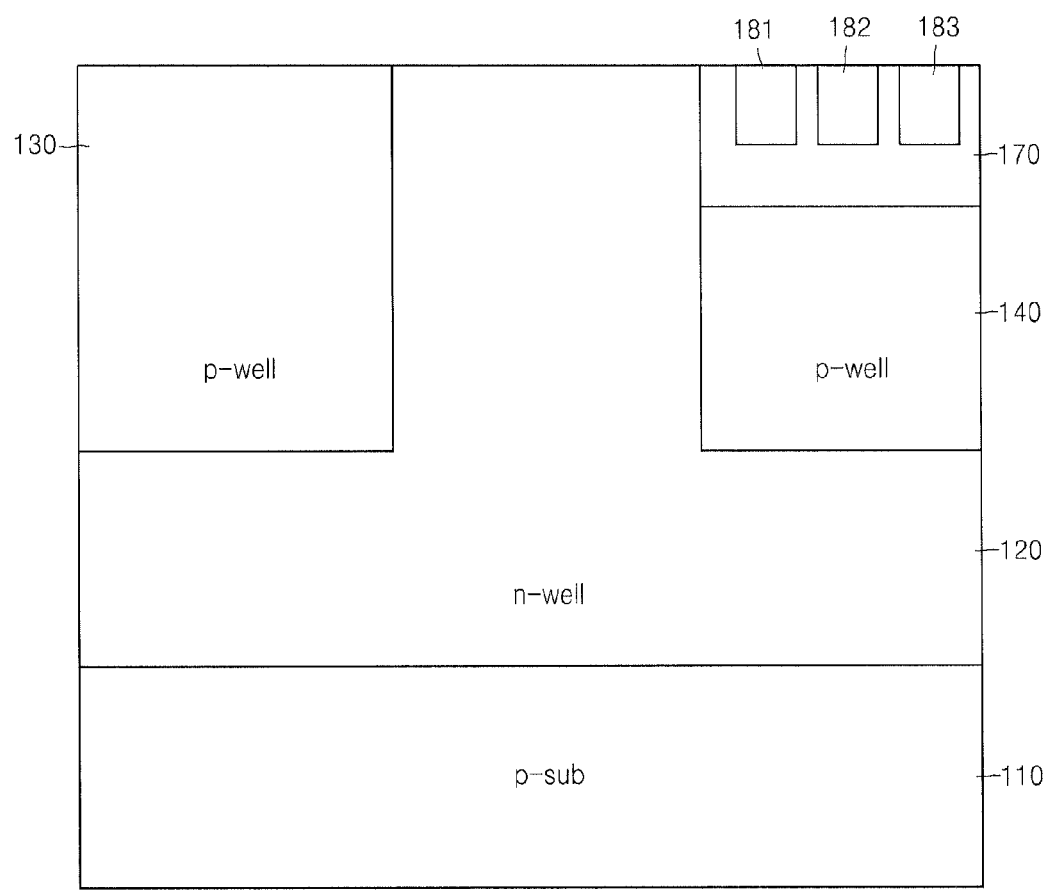
Figure 2C:
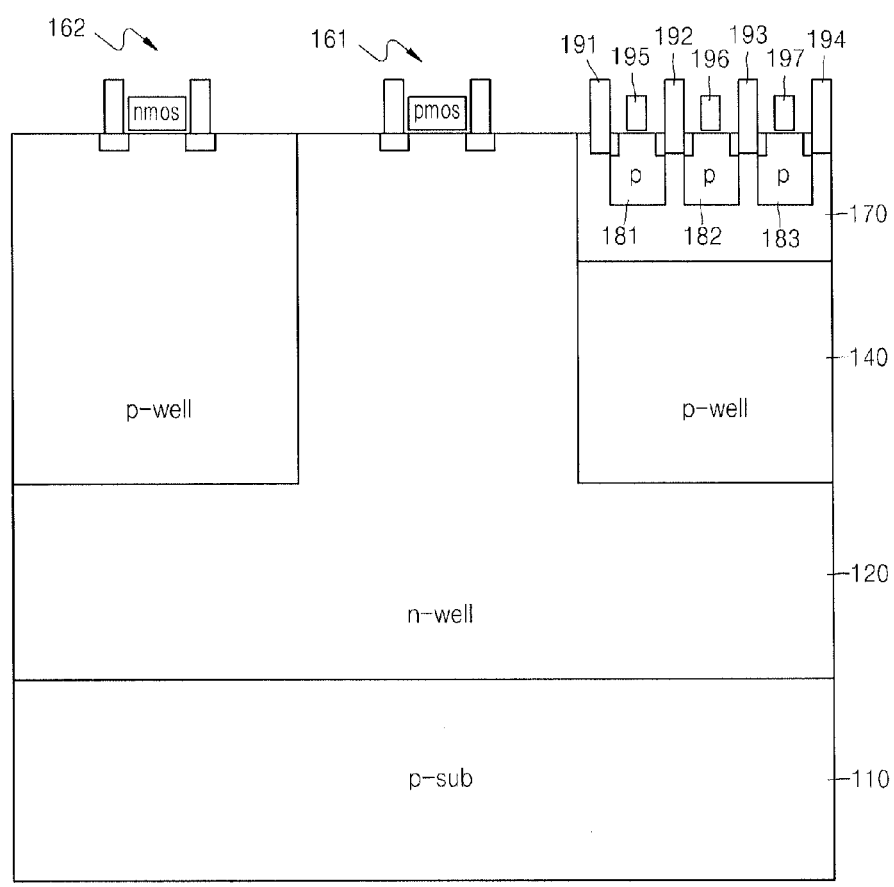

FIGS. 2A-2C are cross-sectional diagrams for describing a method of manufacturing the semiconductor device illustrated in FIG. 1 according to example embodiments of the inventive concepts. Referring to FIG. 2A, the n-type first well 120 may be formed in the p-type substrate region 110. The p-type second and third wells 130 and 140 may be formed in the first well 120. The second and third wells 130 and 140 may be formed in two side regions of the first well 120 so as not to be adjacent to each other. Referring to FIG. 2B, an SOI structure may be formed in the third well 140. The insulating region 170 and the body regions 181-183 may be formed by using a selective etching method (e.g., a selective etching method according to example embodiments described with respect to FIG. 3). Referring to FIG. 2C, a PMOS transistor may be formed on the first well 120 and an NMOS transistor may be formed on the second well 130. 1T-DRAM cells 191-197 may be formed on the third well 140.

Figure 3A:
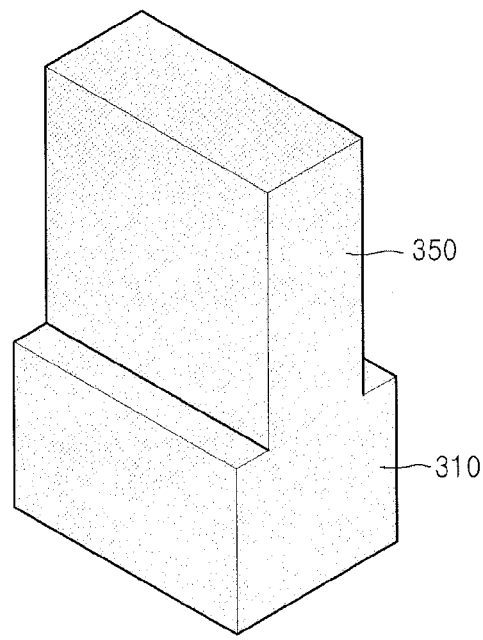
FIGS. 3A-3G are perspective diagrams illustrating a method of forming a silicon on insulator (SOI) structure according to example embodiments of the inventive concepts.
Figure 3B:
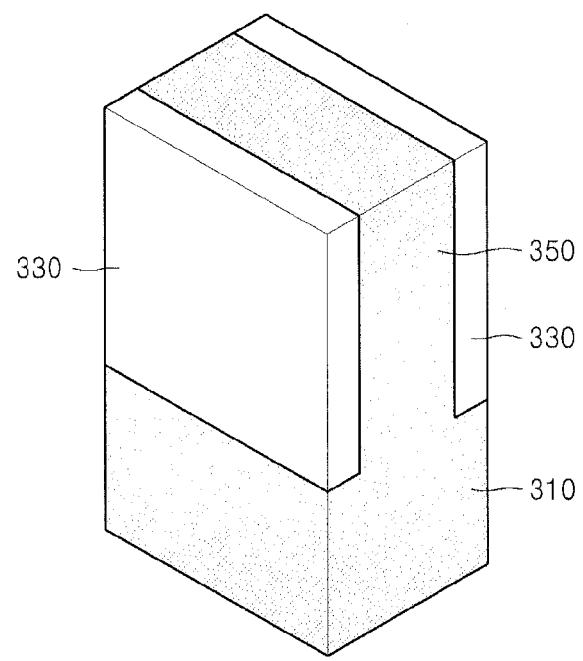

FIGS. 3A-3G are perspective diagrams for describing a method of forming an SOI structure according to example embodiments of the inventive concepts. Referring to FIG. 3A, two side regions of a semiconductor substrate may be patterned from a top surface of the semiconductor substrate. The semiconductor substrate may be a bulk substrate formed from a bulk wafer. A body line pattern 350 may be formed between the patterned regions and a substrate region 310 may be under the body line pattern 350. Referring to FIG. 3B, insulating films 330 may be formed by filling the patterned regions with an insulating material. As a result, the insulating films 330 may be on both side surfaces of the body line pattern 350.

Figure 3C:
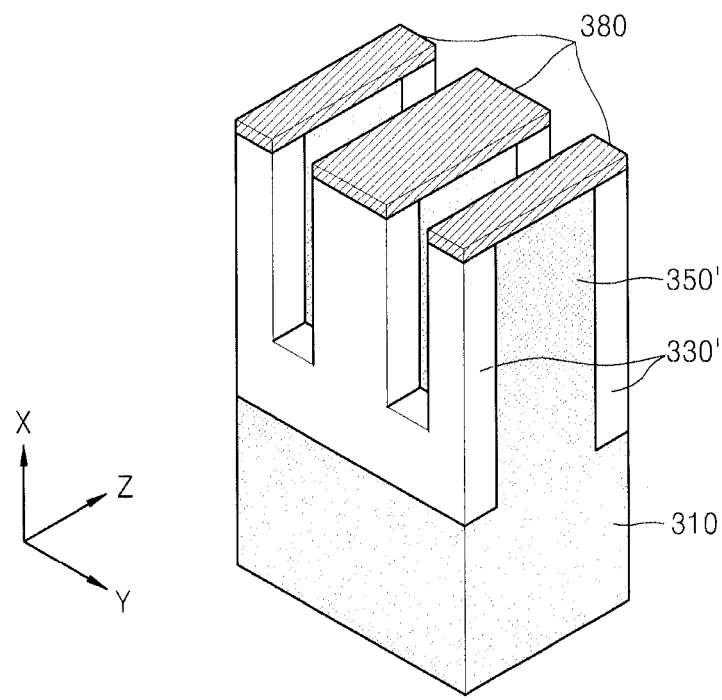

Referring to FIG. 3C, the body line pattern 350 and the insulating films 330 may be patterned in a Z direction to form a plurality of body patterns 350' and a plurality of insulating patterns 330'. In FIG. 3C, the patterning may be performed from top surfaces of the body line pattern 350 and the insulating films 330. The body line pattern 350 illustrated in FIGS. 3A and 3B may be different from the body patterns 350' illustrated in FIG. 3C. Referring to FIG. 3A, the bulk substrate may be patterned in a major axis direction (e.g., Y direction) so as to form the body line pattern 350 that extends in the Y direction. Referring to FIG. 3B, the two side regions of the body line pattern 350 may be filled with the insulating films 330. Referring to FIG. 3C, the body line pattern 350 and the insulating films 330 may be patterned in a major axis direction (e.g., Z direction) that is perpendicular to the Y direction in which the body line pattern 350 extends, so as to form the body patterns 350' that extend in the Z direction.

A height of the body patterns 350' illustrated in FIG. 3C may be less than the height of the body line pattern 350 illustrated in FIGS. 3A and 3B. As shown in FIG. 3C, top surface regions 380 of the body line pattern 350 and the insulating films 330, which are not desired to be patterned, may be masked and regions which are not masked may be patterned.

Figure 3D:
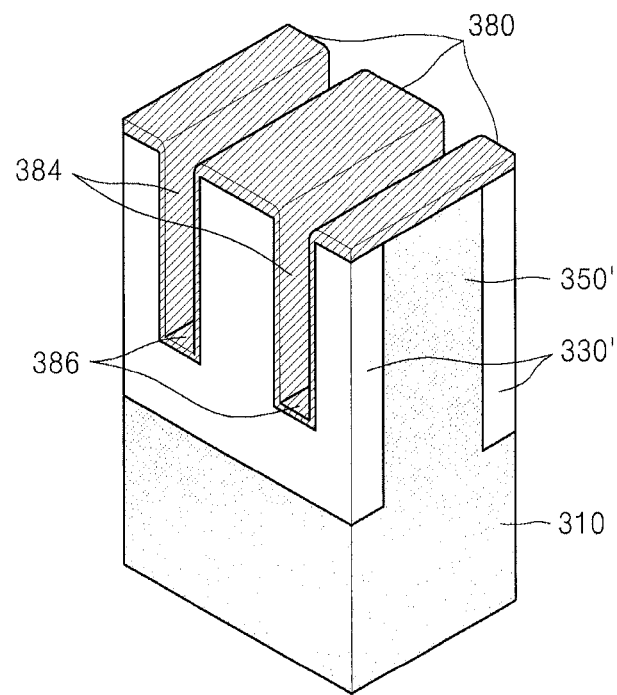
Figure 3E:
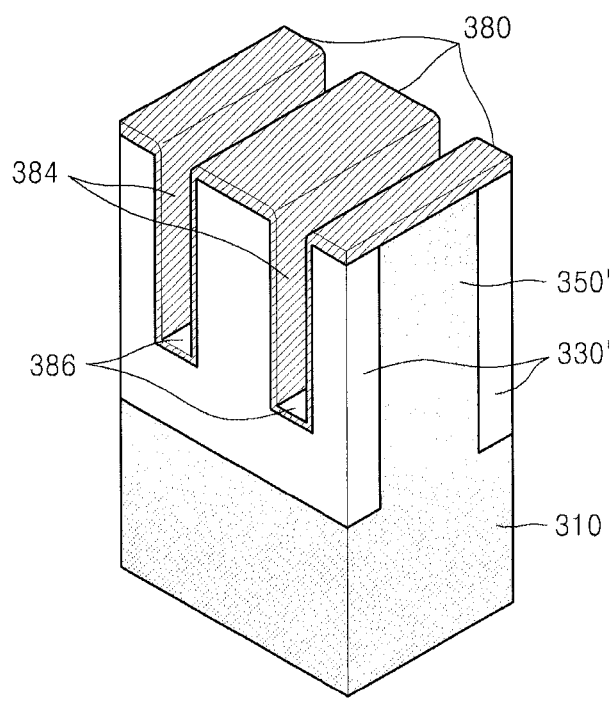
Figure 3F:
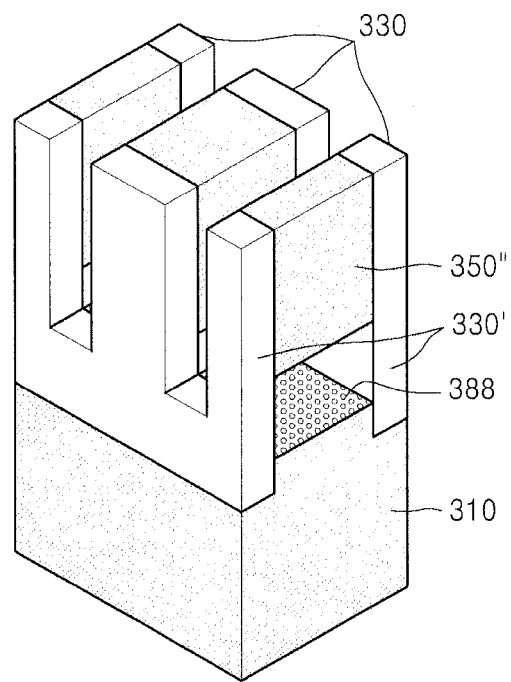

Referring to FIGS. 3D and 3E, side surfaces 384 of the patterned regions may be masked and the bottom surfaces 386 may be exposed. For example, the side surfaces 384 may be masked with the bottom surfaces 386 and then the bottom surfaces 386 unmasked. However, example embodiments of the inventive concepts are not limited thereto. Referring to FIG. 3F, lower regions of the body patterns 350' may be selectively etched through the bottom surfaces 386 which are exposed. A bulk region under the body patterns 350' may be etched through the bottom surfaces 386 by using, for example, a selective wet etching method or a selective dry etching method so as to expose a bottom surface 388 of the bulk region under the body patterns 350'. The top surface regions 380 and the side surfaces 384 of the body patterns 350' and the insulating patterns 330' may be removed. The body patterns 350' may be completely separated from the substrate region 310 so as to form body regions 350". The bulk substrate may be divided into the substrate region 310 and the body regions 350".

Figure 3G:
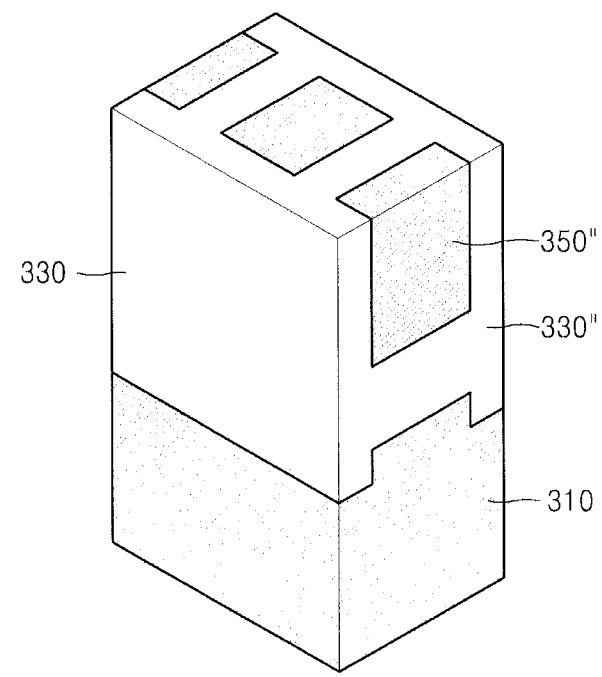

Referring to FIG. 3G, etched regions illustrated in FIG. 3F may be filled with the insulating material. The etched bulk region under the body regions 350" and regions between the body regions 350" may be filled with an insulating material so as to form an insulating region 330". The insulating region 330" may provide support for the body regions 350". In FIG.

3G, the substrate region 310, the insulating region 330", and the body regions 350" may respectively correspond to the third well 140, the insulating region 170, and the body regions 181, 182, and 183 illustrated in FIG. 1. The method illustrated in FIGS. 3A-3G may be used to form a plurality of body regions on a semiconductor substrate. For example, the method may be used to form the body regions 181, 182, and 183 of the semiconductor device illustrated in FIG. 1.

Several regions of a bulk substrate may be etched in parallel in the first direction similarly to FIG. 3A, so as to form a plurality of body line patterns 350 which extend in the Y direction. Regions between the plurality of body line patterns 350 may be filled with the insulating films 330 similarly to FIG. 3B. The bulk substrate may be etched in the Z direction that is perpendicular to the Y direction in which the plurality of body line patterns 350 extend, so as to form body patterns 350' that extend in parallel in the Z direction similarly to FIG. 3C. Side surfaces of the body patterns 350' may be masked similarly to FIG. 3D. A bulk region under the body patterns 350' may be etched through a bottom surface between the body patterns 350' which are not masked similarly to FIG. 3F. The etched bulk region under the body patterns 350' and regions between the body patterns 350' may be filled with an insulating material similarly to FIG. 3G.

FIG. 4 is a cross-sectional diagram of a semiconductor device according to example embodiments of the inventive concepts. Referring to FIG. 4, the semiconductor device may include a substrate region 410, first and second wells 420 and 430, and an SOI structure 440. The SOI structure 440 may be in the substrate region 410. FIG. 4 may be different from FIG. 1 in that the SOI structure 440 may be in the substrate region 410 in FIG. 4, while the SOI structure 150 may be in the third well 140 in FIG. 1. The SOI structure 440 may include an insulating region 470 and body regions 481 and 482. The insulating region 470 and the body regions 481 and 482 may be formed by selectively etching an upper region of the substrate region 410. The substrate region 410 and the body regions 481 and 482 may be of materials having similar characteristics.

A PMOS transistor 461 may be on the first well 420 and an NMOS transistor 462 may be on the second well 430. 1T-DRAM cells 491-493 and 494-495 may be on the substrate region 410. The PMOS transistor 461 and the NMOS transistor 462 may be peripheral circuits for driving the 1T-DRAM cells 491-493 and 494-495. The 1T-DRAM cells 491-495, and the peripheral circuits (the PMOS transistor 461 and the NMOS transistor 462) may be driven by applying different bias voltages to the substrate region 410, the first well 420 and the second well 430.

Figure 5:
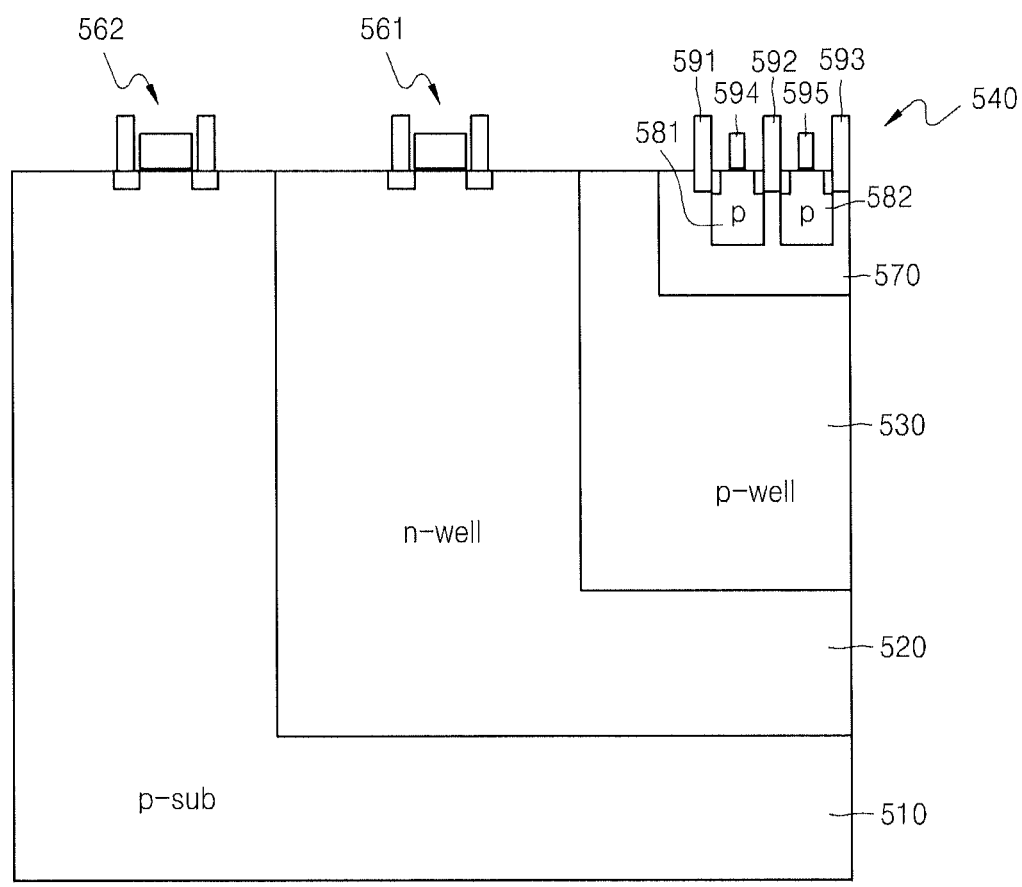

FIG. 5 is a cross-sectional diagram of a semiconductor device according to example embodiments of the inventive concepts. Referring to FIG. 5, the semiconductor device may include a substrate region 510, first and second wells 520 and 530, and an SOI structure 540. The SOI structure 540 may be in the second well 530. FIG. 5 may be different from FIG. 4 in that the SOI structure 540 may be in the second well 530 in FIG. 5 while the SOI structure 440 may be in the substrate region 410 in FIG. 4. The SOI structure 540 may include an insulating region 570 and body regions 581 and 582. The insulating region 570 and the body regions 581 and 582 may be formed by selectively etching an upper region of the second well 530. The second well 530 and the body regions 581 and 582 may be of materials having similar characteristics. A PMOS transistor 561 may be on the first well 520 and an NMOS transistor 562 may be on the substrate region 510. 1T-DRAM cells 591-595 may be on the second well 530.

Figure 6:
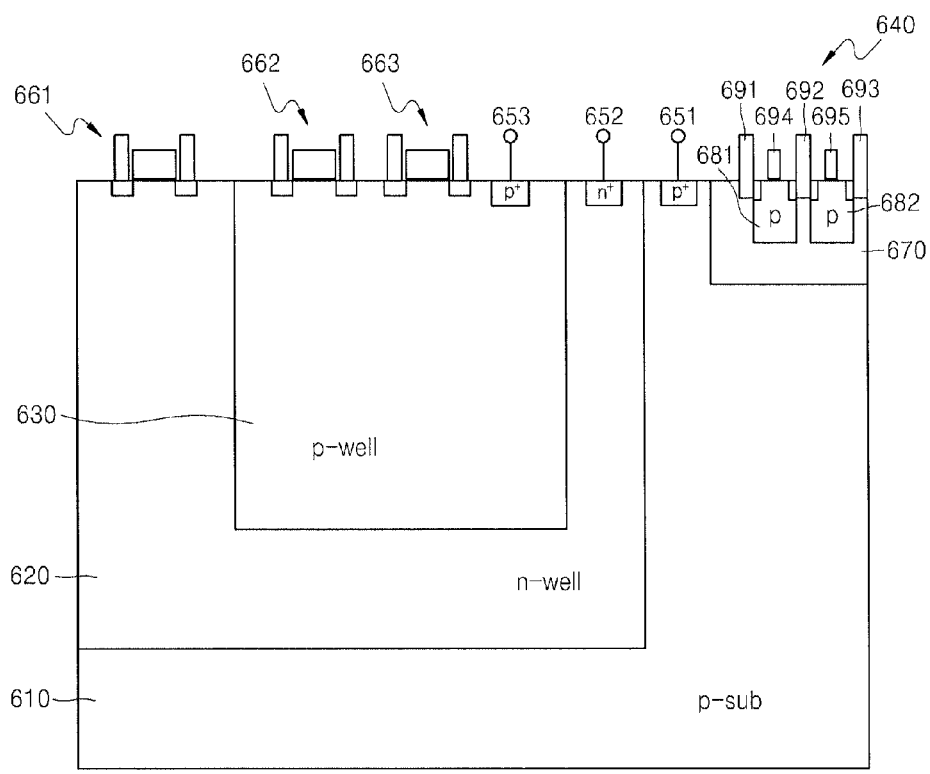

FIG. 6 is a cross-sectional diagram of a semiconductor device according to example embodiments of the inventive concepts. Referring to FIG. 6, the semiconductor device may include a substrate region 610, first and second wells 620 and 630, and an SOI structure 640. The SOI structure 640 may be in the substrate region 610. The SOI structure 640 may include an insulating region 670 and body regions 681 and 682. The insulating region 670 and the body regions 681 and 682 may be formed by selectively etching an upper region of the substrate region 610.

A PMOS transistor 661 may be on the first well 620 and NMOS transistors 662 and 663 may be on the second well 630. 1T-DRAM cells 691-695 may be on the substrate region 610. The PMOS transistor 661 and the NMOS transistors 662 and 663 may be peripheral circuits for driving the 1T-DRAM cells 691-695. Different bias voltages may be applied to the substrate region 610 and the first and second wells 620 and 630 through voltage reception units 651, 652, and 653. Table 2 shows examples of applicable bias voltages. For example, a negative back bias voltage may be applied to the substrate region 610.

TABLE 2

| |
|---|
| V610 (substrate region) $<= 0$ V |
| V620 (first well) $>=$ V610 (substrate region) |
| V620 (first well) $>= 0$ V |
| V630 (second well) $<= 0$ V |
| V620 (first well) $>$ V630 (second well) |

Figure 7:
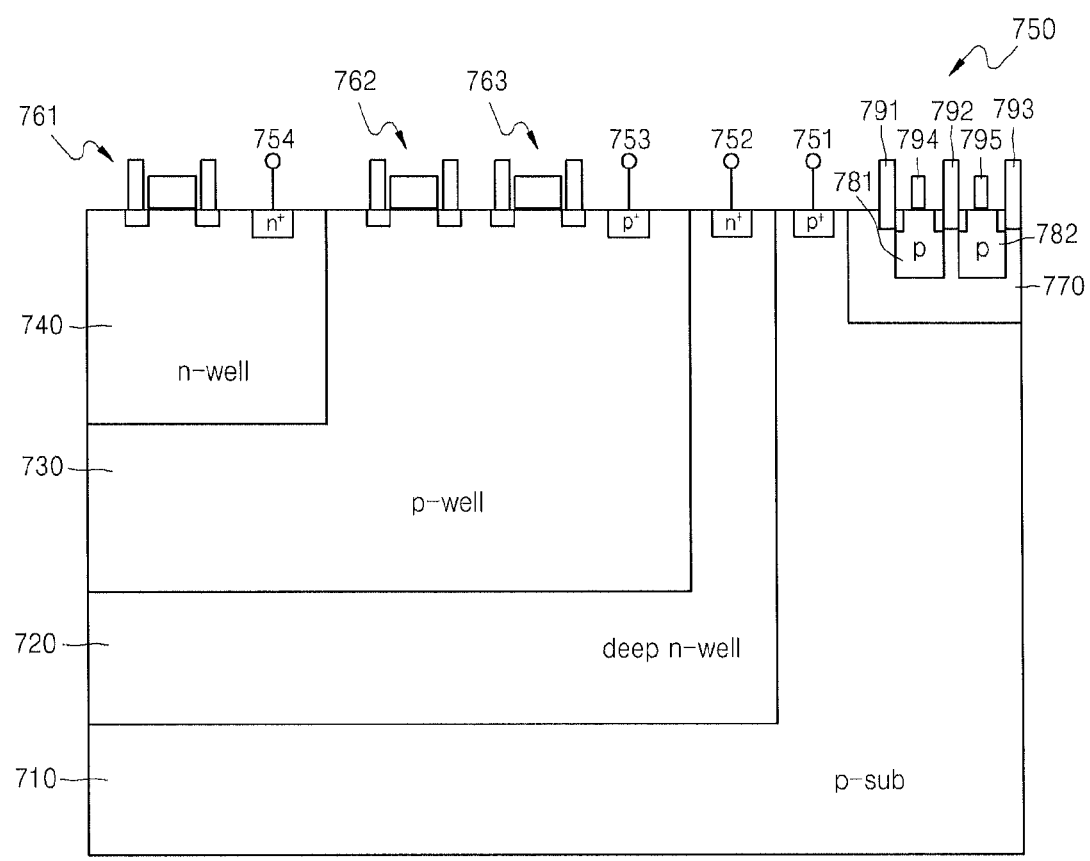

FIG. 7 is a cross-sectional diagram of a semiconductor device according to example embodiments of the inventive concepts. Referring to FIG. 7, the semiconductor device may include a substrate region 710, first through third wells 720, 730, and 740, and an SOI structure 750. The SOI structure 750 may be in the substrate region 710. The SOI structure 750 may include an insulating region 770 and body regions 781 and 782. The insulating region 770 and the body regions 781 and 782 may be formed by selectively etching an upper region of the substrate region 710.

The first well 720 may separate the substrate region 710 from the second and third wells 730 and 740. NMOS transistors 762 and 763 may be on the second well 730 and a PMOS transistor 761 may be on the third well 740. 1T-DRAM cells 791-795 may be on the substrate region 710. Different bias voltages may be applied to the substrate region 710 and the first through third wells 720, 730, and 740 through voltage reception units 751-754. Table 3 may show examples of applicable bias voltages. For example, a positive back bias voltage may be applied to the substrate region 710. If the bias voltages shown in Table 3 are applied, a PNP latch phenomenon and an NPN latch phenomenon may be prevented and/or reduced.

TABLE 3

| |
|---|
| V710 (substrate region) $>= 0$ V |
| V720 (first well) $>=$ V710 (substrate region) |
| V730 (second well) $<= 0$ V |
| V730 (second well) $>$ V720 (first well) |
| V740 (third well) $>= 0$ V |
| V740 (third well) $>$ V730 (second well) |

Figure 8A:
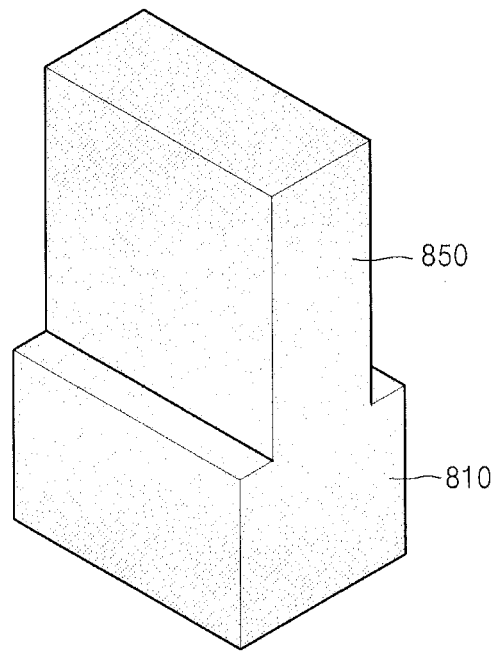
FIGS. 8A-8G are perspective diagrams illustrating a method of forming an SOI structure according to example embodiments of the inventive concepts.
Figure 8B:
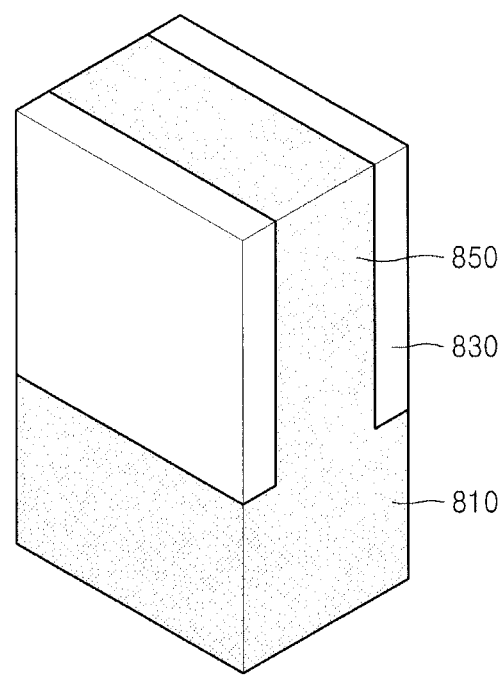
Figure 8C:
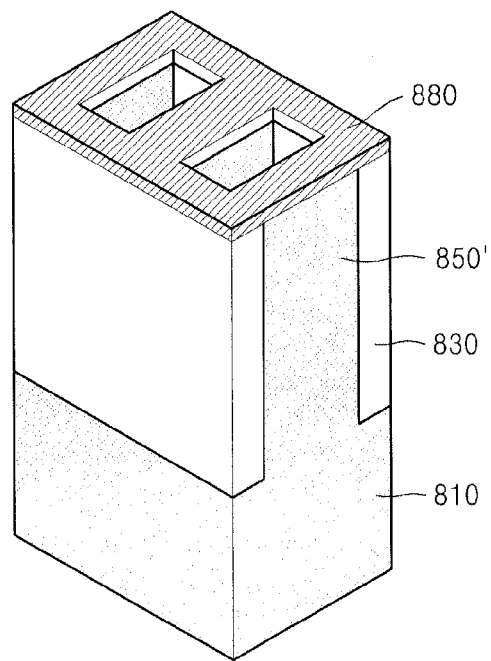

FIGS. 8A-8G are perspective diagrams for describing a method of forming an SOI structure according to example embodiments of the inventive concepts. Referring to FIG. 8A, a bulk substrate may be etched in a major axis direction (e.g., in a Y direction) so as to form a body line pattern 850 that extends in the Y direction. Referring to FIG. 8B, two side regions of the body line pattern 850 may be filled with insulating films 830. Processes in FIGS. 8A and 8B are identical to the processes in FIGS. 3A and 3B and detailed descriptions thereof will be omitted. Referring to FIG. 8C, the body line pattern 850 is patterned in a Z direction that is perpendicular to the Y direction in which the body line pattern 850 extends, so as to form a plurality of body patterns 850' that extend in the second direction. Unlike FIG. 3C, in FIG. 8C, the insulating films 830 may not be patterned. In FIG. 8C, the patterning may be performed from a top surface of the body line pattern 350. As shown in FIG. 8C, top surface regions 880 of the body patterns 850 and the insulating films 830, which are not desired to be patterned, may be masked and regions which are not masked may be patterned.

Figure 8D:
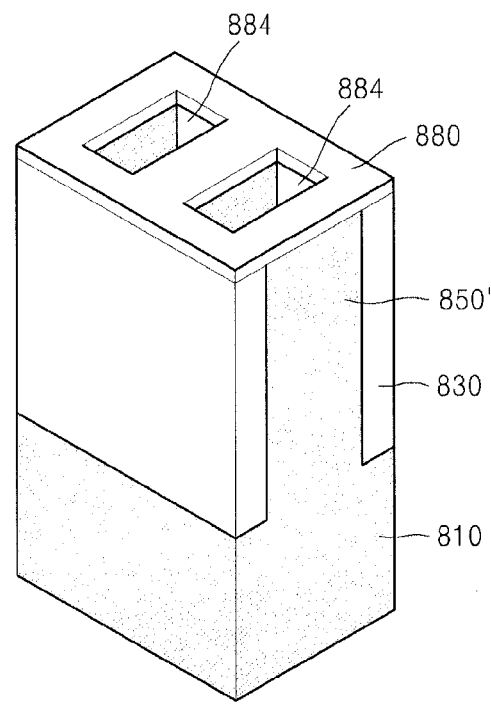
Figure 8E:
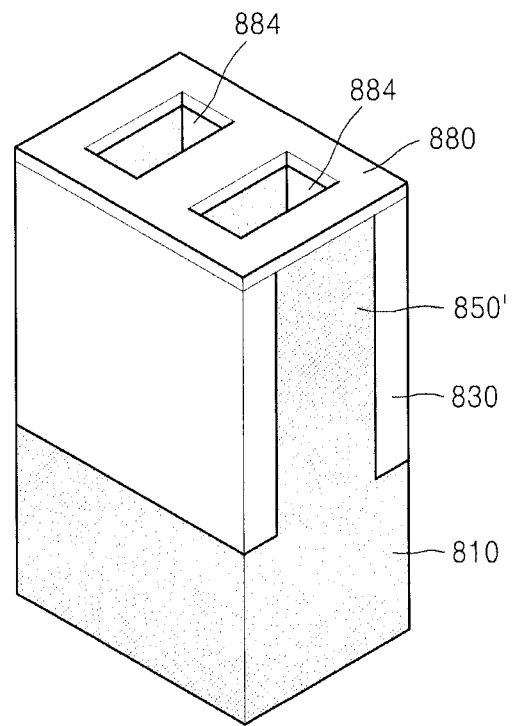
Figure 8F:
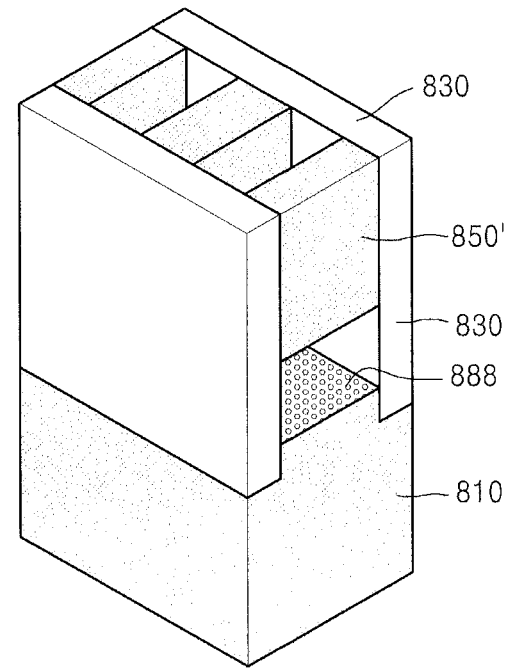
Figure 8G:
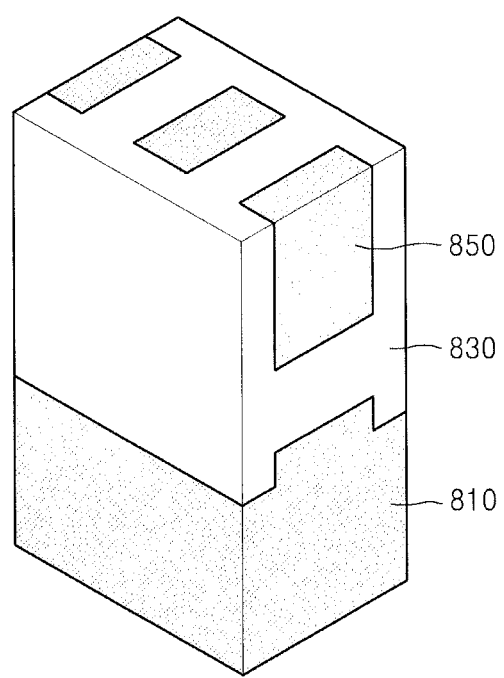

Referring to FIGS. 8D and 8E, side surfaces 884 and bottom surfaces (not shown) of the patterned regions may be masked and then the bottom surfaces may be exposed. Referring to FIG. 8F, lower regions of the body patterns 850' may be selectively etched through the bottom surfaces which are exposed, so as to expose a bottom surface 888 of a bulk region under the body patterns 850'. The top surface regions 880 and the side surfaces 884 of the body patterns 850' and the insulating films 830 may be exposed. Referring to FIG. 8G, etched regions illustrated in FIG. 8F may be filled with the insulating material. The SOI structure illustrated in FIG. 8G may be identical to the SOI structure illustrated in FIG. 3G.

Figure 9A:
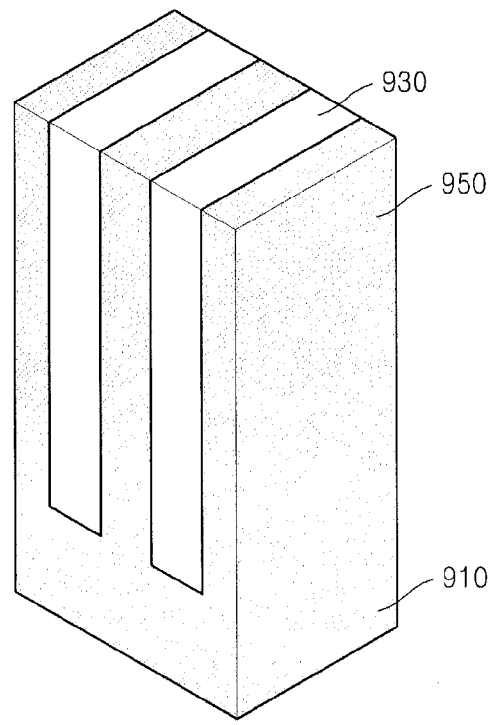
FIGS. 9A-9F are perspective diagrams illustrating a method of forming an SOI structure according to example embodiments of the inventive concepts.

FIGS. 9A-9F are perspective diagrams for describing a method of forming an SOI structure according to example embodiments of the inventive concepts. Referring to FIG. 9A, insulating films 930 may be formed in a bulk substrate. The insulating films 930 may be inserted onto a substrate region 910 that is a bottom region of the bulk substrate. For example, the bulk substrate may be etched in a minor axis direction (e.g., Z direction) so as to form a plurality of body line patterns 950 that extend in the minor axis direction. Regions between the body line patterns 950 may be filled with the insulating films 930. In FIG. 9A, regions of the bulk substrate on sides of the insulating films 930 are referred to as the body line patterns 950 and the remaining region of the bulk substrate is referred to as the substrate region 910.

Figure 9B:
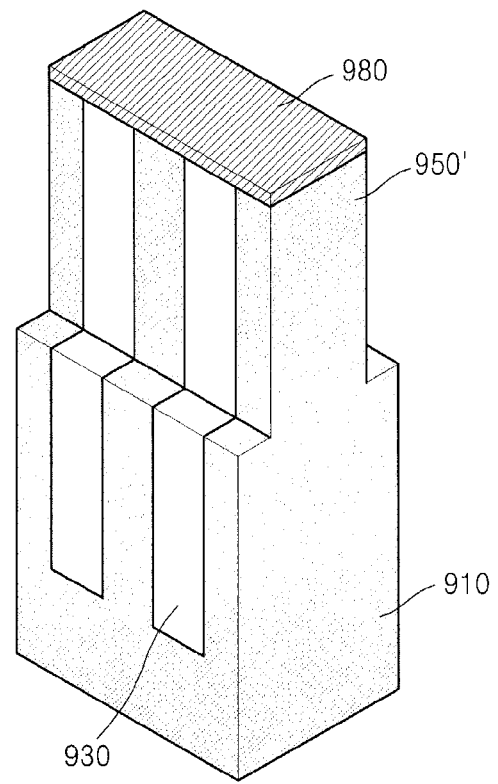

Referring to FIG. 9B, two side regions of the bulk substrate may be patterned in a major axis direction (e.g., Y direction) from the top surface of the bulk substrate. The body line patterns 950 and the insulating films 930 are patterned together so as to form a plurality of body patterns 950' on the substrate region 910. Two side regions of the body line patterns 950 and the insulating films 930 may be etched in the Y direction that is perpendicular to the Z direction in which the body line patterns 950 and the insulating films 930 extend, so as to form the body patterns 950' that extend in the Z direction. For example, top surface regions 980 of the body line patterns 950 and the insulating films 930, which are not desired to be patterned, may be masked and regions which are not masked may be patterned.

Figure 9C:
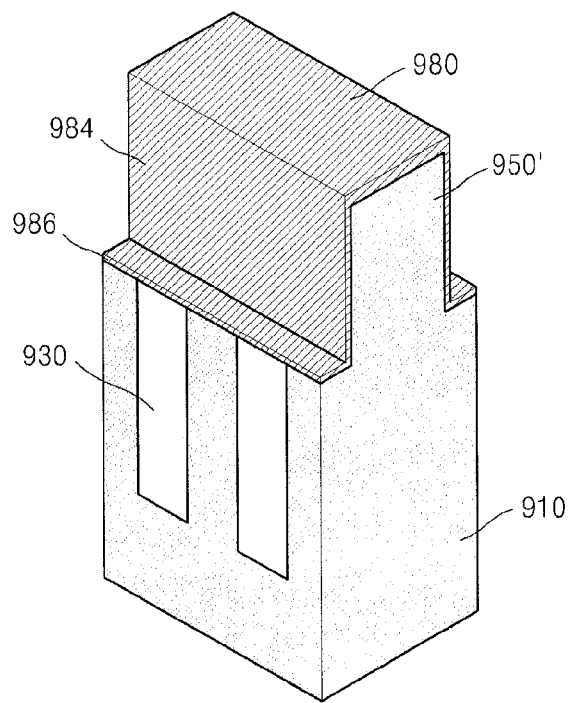
Figure 9D:
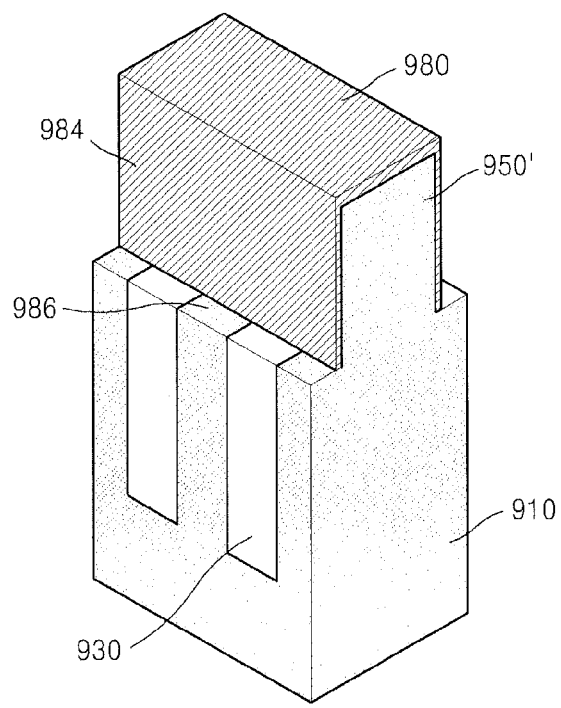
Figure 9E:
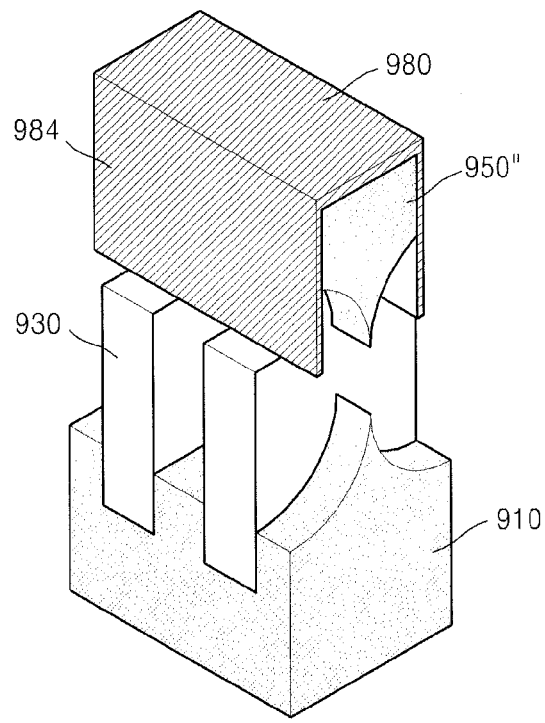

Referring to FIG. 9C, side surfaces 984 and bottom surfaces 986 of the patterned regions may be masked. Referring to FIG. 9D, the bottom surfaces 986 of the patterned regions may be exposed. Referring to FIG. 9E, a bulk region under the body patterns 950' may be selectively etched through the bottom surfaces 986 which are exposed, thereby forming body regions 950". Because the bulk region may be selectively etched, the insulating films 930 may not be etched. The bulk region under the body regions 950" may be etched through the bottom surfaces 986 which are adjacent to the body regions 950" and may not be masked.

Figure 9F:
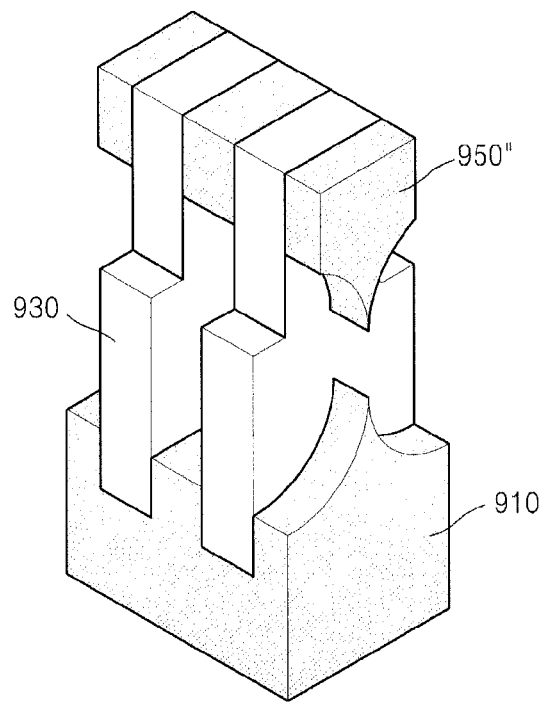

Referring to FIG. 9F, the top surface regions 980 and the side surfaces 984 of the body regions 950" and the insulating films 930 may be exposed. Etched regions illustrated in FIG. 9F may be filled with insulating material so as to completely form the SOI structure. The etched bulk region under the body regions 950" and the etched side regions of the body regions 950" and the insulating films 930 may be filled with the insulating material.

Figure 10:
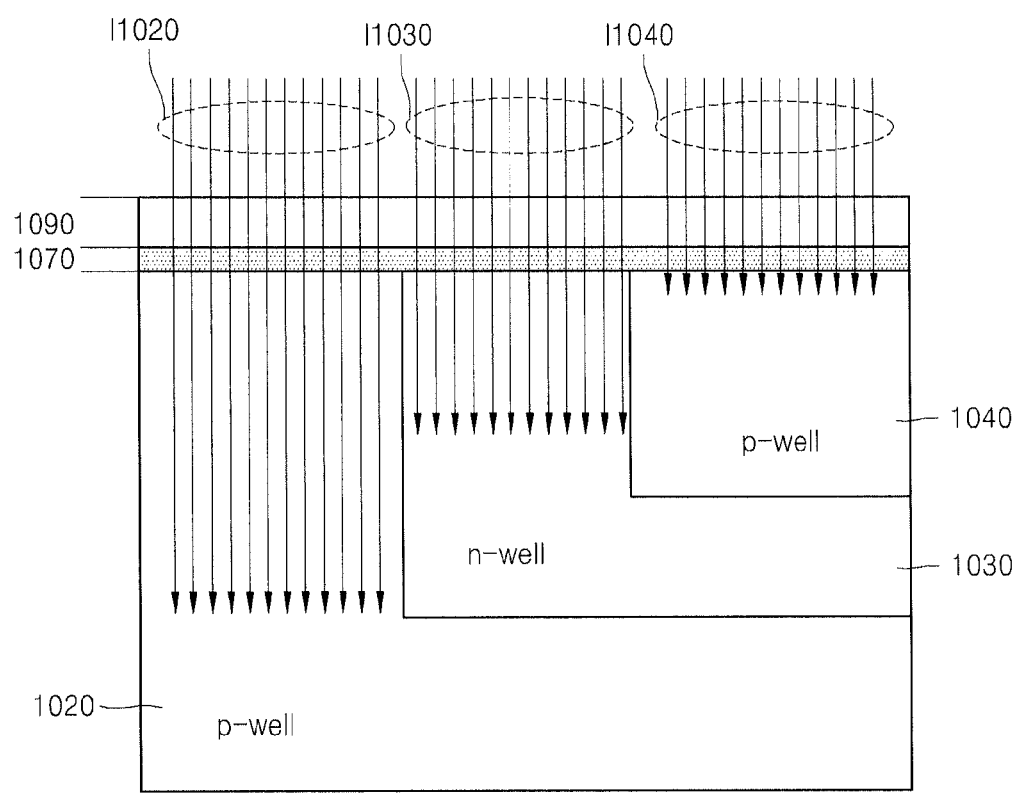

FIG. 10 is a cross-sectional diagram of a semiconductor device according to a comparative example embodiment of the inventive concepts. Referring to FIG. 10, an insulating region 1070 and a silicon region 1090 may be on a bulk substrate and wells 1020, 1030, and 1040 may be formed by using well implants. In FIGS. 10, 11020, 11030, and 11040 represent example paths of the well implants. Because the wells 1020, 1030, and 1040 may be formed by using the well implants in FIG. 10, if the insulating region 1070 and the silicon region 1090 are thick, the wells 1020, 1030, and 1040 may not be appropriately formed. The insulating region 1070 and the silicon region 1090 may be damaged.

In comparison, according to example embodiments of the inventive concepts described with respect to FIGS. 1-9F, because an SOI structure may be formed by selectively etching an upper region of a well (or a substrate region, not shown), the well (or the substrate region) and a body region of the SOI structure may be formed of materials having similar characteristics. According to the comparative example of FIG. 10, if it is assumed that the silicon region 1090 is epitaxially grown on the substrate region that is formed under the well, the silicon region 1090 and the substrate region may not be formed of materials having similar characteristics.

Figure 11:
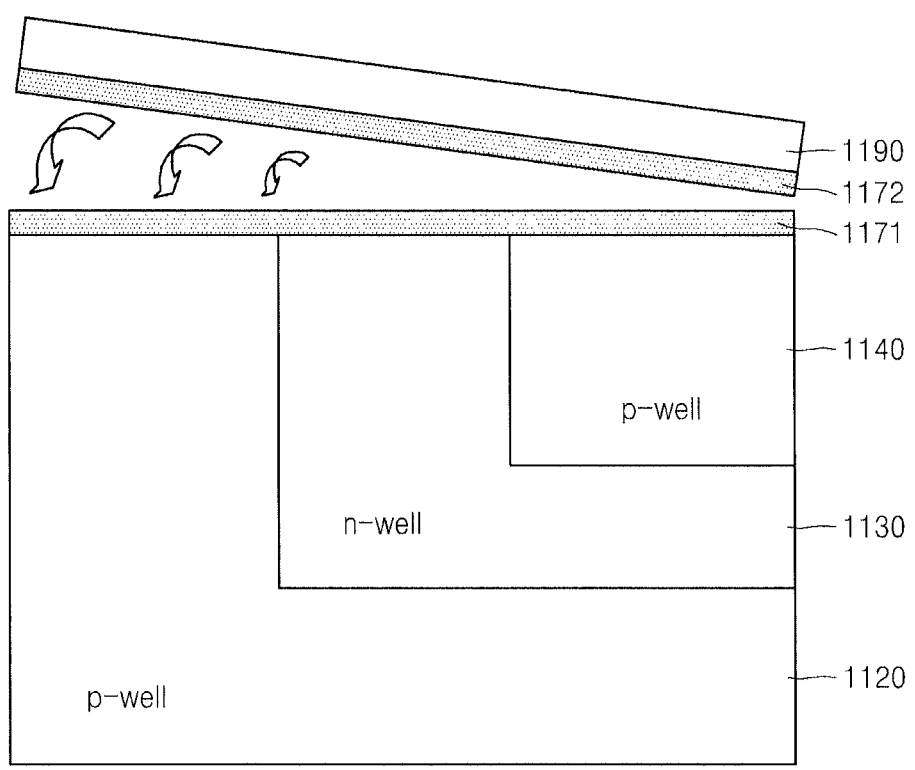

FIG. 11 is a cross-sectional diagram of a semiconductor device according to a comparative example embodiment of the inventive concepts. Referring to FIG. 11, wells 1120, 1130, and 1140 may be formed in a bulk substrate and then an insulating region 1171 may be formed on the wells 1120, 1130, and 1140. An insulating region 1172 and a silicon region 1190 may be bonded to the insulating region 1171 by using a wafer bonding method.

While example embodiments of the inventive concepts have been particularly shown and described, it will be understood by one of ordinary skill in the art that variations in form and detail may be made therein without departing from the spirit and scope of the claims.

What is claimed is:

1. A semiconductor device including a localized silicon on insulator (SOI) structure, comprising:
    a substrate region;
    a first well of a first conductive type in the substrate region;
    a second well of a second conductive type;
    a third well of the second conductive type;
    a silicon on insulator (SOI) structure filling a recess in the substrate region above the third well,
    wherein the second well and the third well are separated by the first well and are formed in two side regions of the first well so as not to be adjacent to each other, at least one of the second well and the third well are on the first well,
    wherein a drain and a source of a first transistor are in the second well, and a drain and a source of a second transistor are in the SOI structure, and
    wherein driving circuits include the first transistor, and memory cells include the second transistor.

2. The semiconductor device of claim 1, wherein a bias voltage applied to the second well is different from a bias voltage applied to the third well.

3. The semiconductor device of claim 1, wherein different bias voltages are applied to the SOI structure in the third well and the driving circuits in the first and second wells.

4. The semiconductor device of claim 1, wherein different bias voltages are applied to the memory cells and the driving circuits.

5. The semiconductor device of claim 1, wherein the driving circuits are not formed on the SOI structure.

* * * * *